(12) United States Patent
Chazal et al.

(10) Patent No.: US 8,854,367 B2
(45) Date of Patent: Oct. 7, 2014

(54) COMPUTING OF A RESULTING CLOSED TRIANGULATED POLYHEDRAL SURFACE FROM A FIRST AND A SECOND MODELED OBJECTS

(75) Inventors: Frederic Chazal, Marsannay-la-Cote (FR); Andre Lieutier, Puyricard (FR); Nicolas Montana, Aix-en-Provence (FR)

(73) Assignee: Dassault Systemes, Velizy Villacoublay (FR)

( * ) Notice: Subject to any disclaimer, the term of this patent is extended or adjusted under 35 U.S.C. 154(b) by 582 days.

(21) Appl. No.: 13/111,471

(22) Filed: May 19, 2011

(65) Prior Publication Data

US 2011/0295564 A1 Dec. 1, 2011

(30) Foreign Application Priority Data

May 25, 2010 (EP) .................................. 10305555

(51) Int. Cl.
*G06T 17/20* (2006.01)
*G06F 17/50* (2006.01)
*G06T 17/10* (2006.01)

(52) U.S. Cl.
CPC ................ *G06F 17/50* (2013.01); *G06T 17/10* (2013.01); *G06T 2210/21* (2013.01)
USPC ............... 345/423; 345/419; 345/428; 703/1; 703/6

(58) Field of Classification Search
CPC ......... G06T 17/00; G06T 15/00; G06T 19/00; G06T 17/20; G06F 17/50; G09G 15/00
USPC ......... 345/419, 420, 423, 424, 428, 440, 441; 382/154, 285; 700/98; 703/1, 2, 6
See application file for complete search history.

(56) References Cited

U.S. PATENT DOCUMENTS 6,392,646 B1 * 5/2002 Yamrom et al. ............. 345/420
6,445,390 B1 * 9/2002 Aftosmis et al. ............ 345/421

(Continued)

OTHER PUBLICATIONS

Cyril Leconte et al. "Exact and Efficient Booleans for Polyhedra". ACM Conference Jan.-Feb. 2010.*

(Continued)

*Primary Examiner* — Kimbinh T Nguyen
(74) *Attorney, Agent, or Firm* — Hamilton, Brook, Smith & Reynolds, P.C.

(57) ABSTRACT

The invention is directed to a computer-implemented process, in a computer-aided geometric design system, for computing a resulting closed triangulated polyhedral surface from a first and a second modeled objects. The first modeled object is modeled by a first closed triangulated polyhedral surface and the second modeled object is modeled by a second closed triangulated polyhedral surface. The process according to the invention comprises:

computing intersections between triangles of the first modeled object and triangles of the second modeled object;

splitting triangles of the first and second modeled objects into polygonal facets adjacent to said intersections;

computing for each triangle and each polygonal facet two couples of winding numbers p and q, wherein the first winding number of each couple of winding numbers is computed from the first closed triangulated polyhedral surface and the second winding number of each couple of winding numbers is computed from the second closed triangulated polyhedral surface;

computing a coefficient k for each triangle and each polygonal facet, the coefficient being computed with a function $\phi$ having as inputs the two couples of winding numbers p and q of each triangle and each polygonal facet;

selecting triangles and polygonal facets according to the computed coefficients;

triangulating said selected polygonal facets; and obtaining the resulting closed triangulated polyhedral surface with the selected triangles and the triangulated selected polygonal facets.

11 Claims, 8 Drawing Sheets

(56) References Cited

U.S. PATENT DOCUMENTS

| | | | |
|---|---|---|---|
| 7,118,442 B2* | 10/2006 | Laliberte et al. | 446/85 |
| 8,331,734 B2* | 12/2012 | Wakayama | 382/304 |
| 2007/0002043 A1* | 1/2007 | Guenter et al. | 345/420 |
| 2008/0225037 A1* | 9/2008 | Khulusi | 345/418 |
| 2010/0121626 A1 | 5/2010 | Montana | |
| 2012/0218265 A1* | 8/2012 | Wakayama | 345/420 |

OTHER PUBLICATIONS

European Search Report, European Application No. EP 10 30 5555.4; Date of Search Oct. 12, 2010; 13 pages.

Feito, F.R. and Rivero, M., "Geometric Modelling Based on Simplicial Chains," *Comut. & Graphics*, 22(5):611-691 (1998).

Fortune, S., "Polyhedral Modelling with Multiprecision Integer Arithmetic," *Computer-Aided Design*, 29(2):123-133 (1997).

García, Á.L., et al., "Free-Form Solid Modelling Based on Extended Simplicial Chains Using Triangular Bezier Patches," *Computers & Graphics*, 27(1):27-39 (2003).

Smith, J.M., and Dodgson, N.A., "A Topologically Robust Algorithm for Boolean Operations on Polyhedral Shapes Using Approximate Arithmetic," *Computer-Aided Design*, 39:149-163 (2007).

Wein, R., "Exact and Approximate Construction of Offset Polygons," *Computer-Aided Design*, 39(6):518-527 (2007).

\* cited by examiner

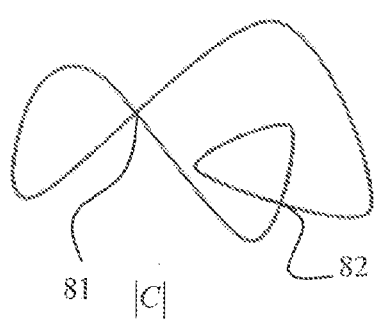
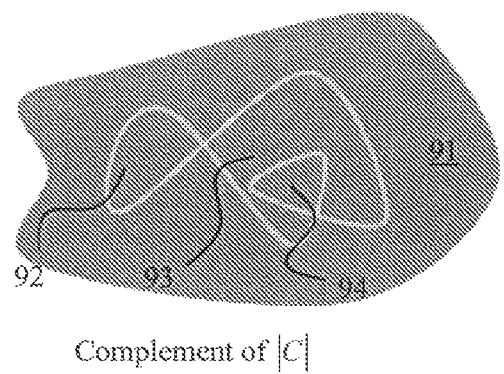
FIG. 8      FIG. 9
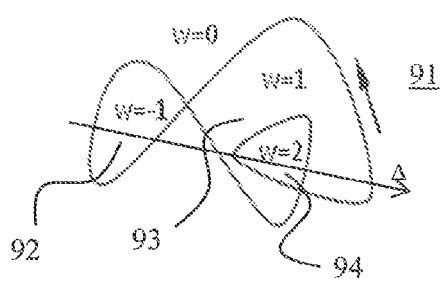
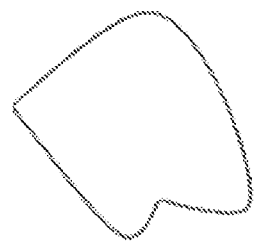
FIG. 10      FIG. 11
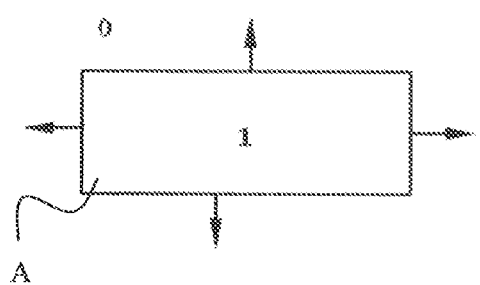
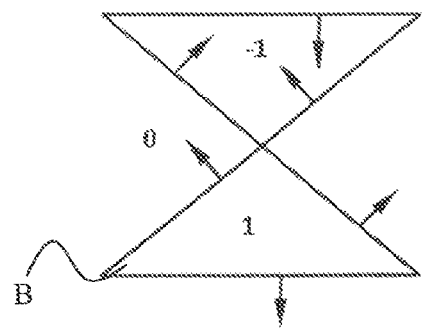
FIG. 12      FIG. 13

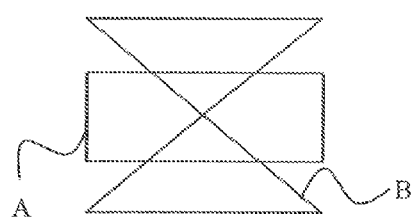
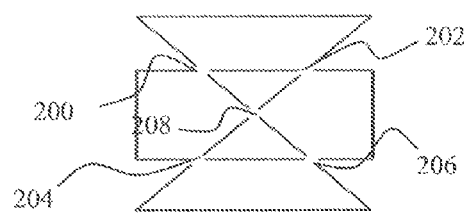
FIG. 19  FIG. 20
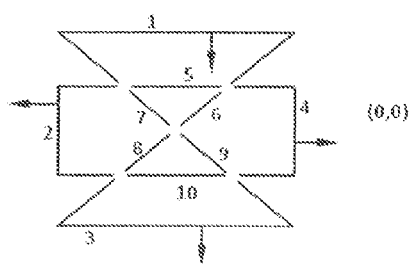
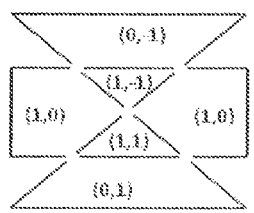
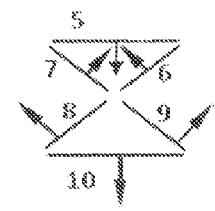
FIG. 21  FIG. 22  FIG. 23
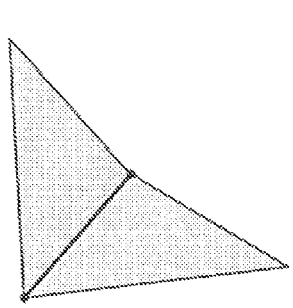
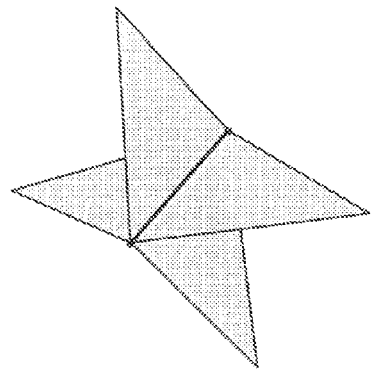
FIG. 24  FIG. 25

COMPUTING OF A RESULTING CLOSED TRIANGULATED POLYHEDRAL SURFACE FROM A FIRST AND A SECOND MODELED OBJECTS

RELATED APPLICATION(S)

This application claims priority under 35 U.S.C. §119 or 365 to European Application No. 10305555.4, filed May 25, 2010. The entire teachings of the above application(s) are incorporated herein by reference.

FIELD OF THE INVENTION

The invention relates to the field of computers programs and systems, and more specifically to the field of computer-aided geometric design (CAGD) and simulation of three-dimensional polyhedral solids.

BACKGROUND

Computer-aided techniques are known to include Computer-Aided Geometric Design or CAGD, which relates to software solutions for representing objects in forms suitable for computer computations in CAD and CAM systems. Computer-aided design (or CAD) relates to software solutions for authoring product design. Similarly, CAE is an acronym for Computer-Aided Engineering, e.g. it relates to software solutions for simulating the physical behavior of a future product. CAM stands for Computer-Aided Manufacturing and typically includes software solutions for defining manufacturing processes and operations.

A number of systems and programs are offered on the market for the design of parts, assemblies of parts and products thereof, such as the one provided by Dassault Systemes under the trademark CATIA (Computer Aided Three Dimensional Interactive Application). CATIA is a multi-platform CAGD/CAD/CAM/CAE software suite, commonly referred to as a 3D Product Lifecycle Management (PLM) software suite. It supports multiple stages of product development (CAx), ranging from conceptualization of objects shapes (CAGD), through design (CAD) and manufacturing (CAM), until analysis (CAE). This software suite is customizable via application programming interfaces (API). Some versions can be adapted in various programming languages, under dedicated APIs.

These so-called CAGD/CAD systems notably allow a user to construct and manipulate complex three dimensional (3D) models of objects or assemblies of objects. CAD systems thus provide a representation of modeled objects using edges or lines, in certain cases with faces. These CAD systems manage parts or assemblies of parts as modeled objects, which are mainly specifications of geometry. In particular, CAD files contain specifications, from which geometry is generated. From geometry, a representation is generated. Specifications, geometry and representation may be stored in a single CAD file or multiple ones. CAD systems include graphic tools for representing the modeled objects to the designers; these tools are dedicated to the display of complex objects—the typical size of a file representing an object in a CAD system extending up to the range of a Mega-byte for part, and an assembly may comprise thousands of parts. A CAD system manages models of objects, which are stored in electronic files.

Designing a mechanical part with a known CAGD/CAD system can be seen as defining the geometrical shape and dimensions of said part so as to fit functional and manufacturing requirements. Mainly, the resulting shape is a combination of basic features such as pad, pocket, groove, shaft etc. created by the designer. Through complex geometrical and topological computations, the CAGD/CAD system yields the boundary representation of the solid (mechanical part) as e.g. a closed and oriented surface.

One knows the concept of swept volumes, e.g. in the field of geometric design (CAGD), machining simulation, robotics, or digital mockup. Given a solid, called "profile" in the following, and a trajectory thereof, we call the swept volume the union of all positions of the profile along the said trajectory. The representation of swept volumes can be used to design shapes, simulate the process of material removal or addition, detect collisions and compute clearance in moving parts and mechanisms. For instance the calculation of a swept volume is useful to determine the required space of a vehicle motor that is vibrating during its functioning. Also, the calculation of a swept volume is useful to determine the required space of a wheel of a vehicle while said wheel turns left and right and moves up and down thanks to shock absorbers. Also, the swept volume is useful to determine the required space of a manufacturing tool.

Computation of so-called swept volumes has been presented in the European Patent Application No. 08291047.2 of Nov. 7, 2008.

Polyhedral modeling and processing is ubiquitous in the context of CAGD. Indeed performing robust and accurate Boolean operations (e.g. union, intersection, subtraction) on polyhedral solids is an essential requirement in this context. Industrial implementation of such operators makes use of floating point representations or integer representations of coordinates together with so called epsilon-programming heuristics.

Roughly speaking, epsilon-programming is to replace equality tests x=y by "up to epsilon" equality tests $|x-y| \le \epsilon$, where $\epsilon$ is the traditional numerical threshold notation. Details can be found in "Robustness and Randomness", D. Michelucci, J. M. Moreau, S. Foufou—Lecture Notes In Computer Science, 2008, Springer.

From a theoretical point of view, usual geometric modeling and processing based on the floating point paradigm lack rigorous and scientific foundation. In practice, developing a robust Boolean operator based on floating point framework is difficult, costly and is more an art than a science. Indeed, the floating point rounding errors may induce combinatorial inconsistencies, e.g. topological inconsistencies.

The epsilon-programming paradigm allows overcoming these inconsistencies but, the techniques based on the epsilon-programming are not supported by a sound theoretical framework: indeed, they require case by case expertises which make the achievement of complete robustness a never ending task.

Alternatively recent implementations use the exact computation paradigm based on the exact predicates technology, as detailed in "Robustness in geometric computations", C. M. Hoffmann, Journal of Computing and Information Science in Engineering, 1:143, 2001, "Robust geometric computation", C. K. Yap, Handbook of discrete and computational geometry, pages 653-668, 1997, and "Efficient Delaunay triangulation using rational arithmetic", M. Karasick, D. Lieber, and L. R. Nackman, ACM Transactions on Graphics (TOG), 10(1):71-91, 1991.

In the exact computation paradigm, when some geometry has to be constructed, one has to use rational or algebraic numbers representations in the result which leads to time and space consuming algorithms. As, in real life CAGD applications, the input of a geometric processing algorithm is generally the output of a previous one, a pure exact computation approach is not possible since it would produce an exponential growth of the number representations.

It is therefore necessary to "round" the coordinates of the output from rational to floating point numbers. Unfortunately, such a rounding procedure is not safe in general. Indeed, this rounding may create local self-intersections, as illustrated on FIG. 1. The polygon 4 is a valid one because there is no self-intersection. The background grid represents the rounded numerical values. Rounding is to replace each vertex of the initial polygon by its closest point of the grid. The dotted polygon 2 is the rounding result of the black polygon, and this polygon 2 is invalid because of a self intersection 3.

Such a self-intersection invalidates the result because no self intersection is allowed. Moreover, a self-intersection is likely to make further algorithms fail.

The natural relationship between conventional polyhedral representations of solids with polyhedral chains have been highlighted in the two following papers: "Convex polyhedral chains: a representation for geometric data", O. Gunther and E. Wong, Computer Aided design, volume 21 number 3 April 1989 and "Geometric modelling Based on simplicial chains", F. R. Feito and M. Rivero, Comput. & Graphics, Vol. 22, No. 5, pp. 611-619, 1998.

In the first paper, the authors suggest to represent the solid through a kind of CSG (constructive solid geometry). The chains are expressed as linear combinations of polytopes, each polytope being represented by its associated finite family of half-spaces. Implementing modeling operators such as Boolean operations on this representation does not require the construction of any explicit vertex, since the robustness of the approach consists precisely on avoiding vertex based representations.

The second paper shows simple relationships between Boolean operators and algebraic operations on the corresponding chains and in particular on a representation called "normal chain", where a chain is expressed as linear combinations of oriented simplices sharing all the origin as one of their vertices. For example, the intersection of two solids, represented by chains formal sum of respectively n and m tetrahedra, consists in a formal sum of n*m triangulation of the intersection of the corresponding n*m pairs of tetrahedra.

Both papers highlight the natural relationship between conventional polyhedral representations of solids with polyhedral chains. However, these papers rely on Boolean operations which are not generalized Boolean operators.

In fact, all CAGD systems implement Boolean operations through the same structure. Details of the algorithm may change from a CAGD system to another, but the main steps are the same. The inputs of the Boolean operation are two solids A and B defined by their valid boundary representation. Valid boundary representation means that the boundary of the solid is a closed surface with no self-intersection. Standard Boolean operations are union, intersection and subtraction, which are in general noted ∪, ∩ and −.

Traditional algorithms strongly rely on the hypothesis that the input solids are valid, and provides a valid solid. In other words, the boundary solids A and B do not have any self intersection. The steps of a tradition algorithm are the following, in relations with FIGS. 2-7:

1. Input two solids A and B defined by their valid boundary representation (FIG. 2);
2. Trim the boundary of solid A with the boundary of solid B, and inversely (FIG. 3).
3. Position each portion of the boundary of solid A with respect to solid B. Portions of boundary of solid A are inside or outside solid B (FIG. 4).
4. Position each portion of the boundary of solid B with respect to solid A. Portions of boundary of solid B are inside or outside solid A (FIG. 5).
5. Depending on the Boolean operation type, discard the useless portions of boundary:
   (i) Union A+B: discard portions of boundary of solid A inside solid B and portions of boundary of solid B inside solid A.
   (ii) Intersection A·B: discard portions of boundary of solid A outside solid B and portions of boundary of solid B outside solid A.
   (iii) Subtraction A−B: discard portions of boundary of solid A inside solid B and portions of boundary of solid B outside solid A (FIG. 6).
6. Synthesize the resulting solid by merging the portions of boundary provided by previous step (FIG. 7).

To summarize the above analysis, the prior art shows too much sensitivity with respect to rounding errors because usual polyhedral representations depend on numerical values. Indeed, a state of the art polyhedron may produce self-intersections, thus making the result inconsistent according to the state of the art validity criterion. Consequently, there is a lack of robustness of the solutions of the prior art as their validity may be affected.

SUMMARY OF THE INVENTION

Accordingly, there remains a need for a robust and generalized Boolean operators and an accurate method of computing a boundary of a modeled object thanks to these robust and generalized Boolean operators.

According to a first aspect, the invention is embodied as a computer-implemented process, in a computer-aided geometric design system, for computing a resulting closed triangulated polyhedral surface from a first and a second modeled objects, the first modeled object being modeled by a first closed triangulated polyhedral surface and the second modeled object being modeled by a second closed triangulated polyhedral surface, the process comprising:
  computing intersections between triangles of the first modeled object and triangles of the second modeled object;
  splitting triangles of the first and second modeled objects into polygonal facets adjacent to said intersections;
  computing for each triangle and each polygonal facet two couples of winding numbers p and q, wherein the first winding number of each couple of winding numbers is computed from the first closed triangulated polyhedral surface and the second winding number of each couple of winding numbers is computed from the second closed triangulated polyhedral surface;
  computing a coefficient k for each triangle and each polygonal facet, the coefficient being computed with a function φ having as inputs the two couples of winding numbers p and q of each triangle and each polygonal facet;
  selecting triangles and polygonal facets according to the computed coefficients;
  triangulating said selected polygonal facets; and
  obtaining the resulting closed triangulated polyhedral surface with the selected triangles and the triangulated selected polygonal facets.

In embodiments, the process may comprise on or more of the following features:
  at least one of the first or second modeled objects modeled by a closed triangulated polyhedral surface comprises a self intersection; and the step of computing intersections between triangles further comprises computing intersections between triangles of said at least one of the first or second modeled objects modeled by a closed triangulated polyhedral surface;

computing at least one region, wherein a region comprises a set of triangles and/or polygonal facets adjacent to each other and delimited by one of the computed intersections;

determining all triangles and/or polygonal facets of said region, the triangles and/or polygonal facets being adjacent to a common computed intersection, each triangle and/or polygonal facet comprises a normal vector defined according to the own geometry and the own orientation of the said each triangle and/or polygonal facet; computing a two couples of winding numbers p and q for a given triangle or a given polygonal facet; starting from the given triangle or the given polygonal facet, rotating according to a radial order around said computed intersection; detecting the crossing of the other triangles and/or polygonal facets adjacent the said computed intersection; after each crossing, updating the said two couples of winding numbers p and q according to the orientation of the normal vector of said crossed triangle and/or polygonal facet;

the first couple of winding numbers $C_{below}$ is below said triangle and polygonal facet according to a normal vector of said triangle and polygonal facet; and the second couple of winding numbers $C_{above}$ is above said triangle and polygonal facet according to the normal vector of said triangle and polygonal facet;

the function φ having as inputs the two couples of winding numbers p and q of each triangle and each polygonal facet performs one of the following operations:

φ(p, q)=min(1, p+q)

φ(p, q)=p*q

φ(p, q)=max(0, p−q);

the triangles and polygonal facets are selected when the computed coefficient k is different from zero.

at the step of computing intersections, common edges or common vertice between the triangles of the first modeled object and the triangles of the second modeled object of triangles are excluded;

the step of computing intersections is carried out by using exact arithmetic;

after the step of splitting triangles, a step of computing an overlay representing the computed intersections;

the computed overlay has rational coordinates.

According to another aspect, the invention is embodied as a computer program, stored on a computer readable medium, for computing a resulting closed triangulated polyhedral surface from a first and a second modeled objects, the first modeled object being modeled by a first closed triangulated polyhedral surface and the second modeled object being modeled by a second closed triangulated polyhedral surface, the computer program comprising code means for causing a computer to take the steps of the process.

According to another aspect, the invention is embodied as an apparatus for computing a resulting closed triangulated polyhedral surface from a first and a second modeled objects, the first modeled object being modeled by a first closed triangulated polyhedral surface and the second modeled object being modeled by a second closed triangulated polyhedral surface, the apparatus comprising means for implementing the steps of the process.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

A system embodying the invention and a process according to the invention will now be described, by way of non-limiting example, and in reference to the accompanying drawings, where:

FIGS. 8 and 9 are examples of the support and the complement of a simplicial 2-cycle;

FIG. 10 illustrates the winding numbers of the self intersecting simplicial 2-cycle of FIGS. 8 and 9;

FIG. 11 exemplifies the solid defined by a positive winding number of FIG. 10;

FIGS. 12 to 17 are examples illustrating the definition of a generalized Boolean operation;

FIGS. 19 to 23 are examples illustrating the process depicted on FIG. 18;

FIGS. 24 and 25 are examples of manifold and non-manifold edges;

DETAILED DESCRIPTION OF THE EMBODIMENTS

Figure 1:
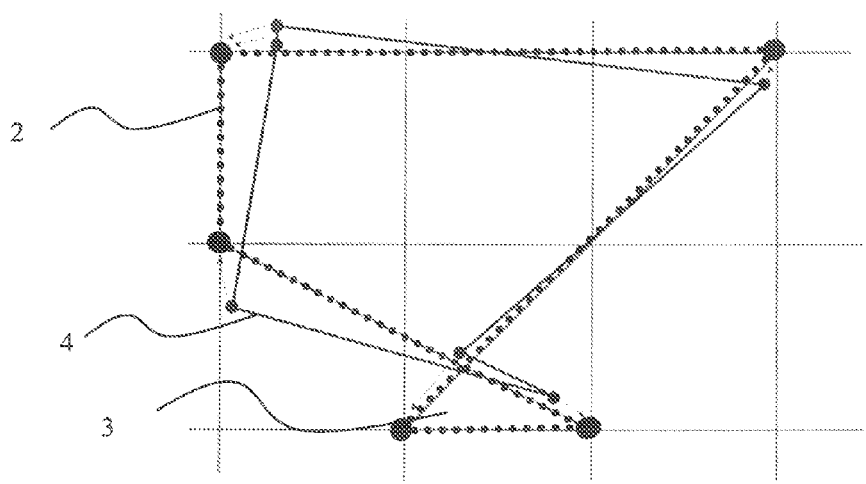
FIG. 1 is an example of a local self-interaction created by a rounding of coordinates from rationale to floating point numbers.
Figure 2:
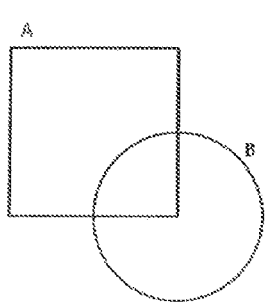
FIGS. 2 to 7 exemplify the steps of a traditional algorithm for performing Boolean operations on two boundaries of solids.
Figure 3:
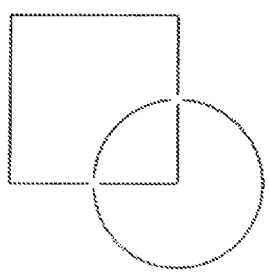
Figure 4:
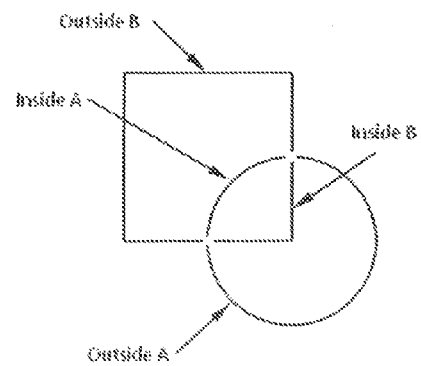
Figure 5:
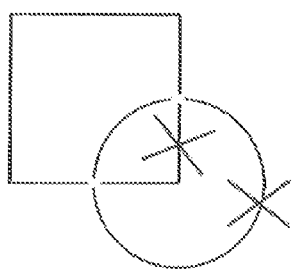
Figure 6:
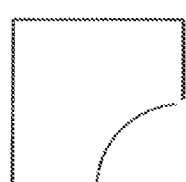
Figure 7:
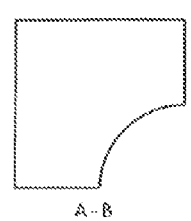

The teachings of all patents, published applications and references cited herein are incorporated by reference in their entirety.

The invention is directed to a computer-implemented process, in a computer-aided geometric design system, for computing a resulting closed triangulated polyhedral surface from a first and a second modeled object. The first modeled object is modeled by a first closed triangulated polyhedral surface and the second modeled object is modeled by a second closed triangulated polyhedral surface. The process comprises a step of computing intersections between triangles of the first modeled object and triangles of the second modeled object. Next, triangles of the first and second modeled objects are split into polygonal facets adjacent to said intersections. Then, two couples of winding numbers (noted p and q) are computed for each triangle and each polygonal facet. The first winding number of each couple of winding numbers is computed from the first closed triangulated polyhedral surface and the second winding number of each couple of winding numbers is computed from the second closed triangulated polyhedral surface. Then, a coefficient (noted k) is computed for each triangle and each polygonal facet. This coefficient is computed with a function φ which has as inputs the two couples of winding numbers (noted p and q) of each triangle and each polygonal facet. Next, triangles and polygonal facets are selected according to the computed coefficients. The polygonal facets are triangulated, and the resulting closed triangulated polyhedral surface is obtained with the selected triangles and the triangulated selected polygonal facets.

Advantageously, the invention provides a general, efficient and robust method suited to compute quickly and accurately a Boolean operation between a first and a second modeled objects that are modeled by a closed triangulated polyhedral surface and represented as a polyhedral cycle such as for example a simplicial 2-cycle. Operands validity checking is faster as it is no more necessary to verify whether the first and/or the second modeled objects have self-intersections. Accordingly, the unique criterion to check is the watertightness of the first and the second modeled objects. Moreover, if this criterion of watertightness is respected, the invention can therefore guaranty a quality of the result. In other terms, successive operation on the first and/or the second modeled objects can be performed without introducing a failure. The robustness is thus increased as several operations can be successively performed. Furthermore, the operations are generalized thanks to the concept of inner and outer space obtained via the computating of couples of winding numbers, e.g. by keeping only positive winding numbers.

A simplicial complex is a topological space constructed by "gluing together" points, line segments, triangles, and more generally, their p-dimensional equivalents. One of the advantages of using simplicial complexes is that their properties can be generalized for any dimension m. Simplicial complexes make it possible to compute a boundary of a modeled object thanks to simple mathematic operations, what requires less resources than other methods described in the European Patent Application No. 08291047.2 of Nov. 7, 2008 on pages 2 to 5. In particular, a simplicial complex provides a closed and topologically consistent polyhedral representation. Though this representation may intersect itself, it is combinatorial watertight. In particular, if a small perturbation or a floating point rounding is applied to the output, it remains valid (topologically correct and watertight), hence providing robustness.

A simplicial 2-chain is a particular case of a simplicial complex. A simplicial 2-chain in the three-dimensional Euclidean space is defined by a finite set of vertices given by their coordinates in 3D space together with a set of triangles. Each triangle is defined by an ordered triple of indexes of vertices and an integer number defining its multiplicity. The operation consisting of simultaneously changing the sign of the multiplicity of a triangle and the order of the triple defining it does not change the chain. A simplicial 2-cycle is a simplicial 2-chain satisfying the zero boundary condition defined below.

Advantageously, the invention provides robustness compared to the prior art because the validity criterion of a simplicial 2-cycle representing a solid is purely combinatorial: unlike usual polyhedral representation it does not depend on numerical values.

In particular, the proposed generalized Boolean operator is numerical rounding resistant and the rounding of coordinates does not affect the validity of an operand. For example, applying a rotation, using floating point arithmetic, on the vertices of an operand maintains the combinatorial structure and so does not affect its validity. Conversely, applying the same rotation (a very usual operation indeed) to a state of the art polyhedron may produce self-intersections, thus making the result inconsistent according to the state of the art validity criterion (as discussed above in reference to FIG. 1).

In other words, the invention is a generalized Boolean operator, applying on representations of solids by simplicial 2-cycles whose vertices coordinates use fixed length number representations such as integers or floating points. Roughly speaking, a simplicial 2-cycle is a closed triangulated polyhedral surface that may feature self intersections.

Referring now to FIG. 8, given a simplicial 2-cycle noted C, the support |C| of C is defined as the union of all the triangles of the simplicial 2-cycle C. The support |C| is a therefore a subset of the 3D space $R^3$. In FIG. 8, |C| is the support of C that features two self intersections 81 and 82.

It is defined the "support" of a "polyhedral cycle" (e.g. simplicial 2-cycle noted C) which is the union of all triangles of the polyhedral cycle. The connected components of the complement of the support of the polyhedral cycle $\square$ in 3D space are called 3D cells. Only one 3D cell is not bounded and is called the "outer cell".

Referring now to FIG. 9, the 3D complement of |C|, noted $R^3-|C|$, includes at least two connected components. The grey area represents the connected components of the complement of |C|. There are four connected components 91, 92, 93, and 94. Beyond the four components, the "outside" 91 is unbounded.

To each point of the complement of |C| is associated a well defined integer number called the winding number, as illustrated on FIG. 10. The winding number is a constant number over each connected component of the complement of |C| 92, 93, and 94, and any winding number is not defined on |C|.

Given a polyhedral cycle such as the simplicial 2-cycle noted C, recall that each triangle of C is oriented by the ordering of its three vertices and this ordering defines a normal vector. Furthermore, each triangle of C has an integer multiplicity. Given a point X in 3-space which does not belong to any triangle from C, the winding number of X with respect to C is an integer number W defined as follows.

For the sake of explanation, one reminds that a polyhedral-cycle (e.g. a simplicial 2-cycle) respects a condition called zero boundary condition. When a polyhedral-cycle meets the zero boundary condition, the watertight property is conferred to polyhedral-cycle. Indeed, a polyhedral-cycle is a set of oriented simplices with a signed integer, called multiplicity, assigned to each simplex. For instance, the multiplicity of an edge is the number of multiple edges sharing the same end vertices.

Consider an oriented half line $\Delta$ starting at X and intersecting no edge from C$\square$, as represented on FIG. 10. Such a half line $\Delta$ always exists. Call $\delta$ the unit vector defining the direction of $\Delta$ pointing from X toward infinity. When $\Delta$ intersects a triangle T from C, we say that $\Delta$ crosses T forward if the dot product of $\delta$ with the normal $\eta_T$ of T is positive and backward if it is negative. It cannot be zero, as this would imply that $\Delta$ intersects at least one edge from C.

One initializes the integer W with the value W=0. Each time $\Delta$ crosses a triangle T from C with multiplicity $\mu_T$, increment W of $\mu_T$ if $\Delta$ crosses T forward and decrement W of $\mu_T$ if $\Delta$ crosses T backward. This may be noted W:=W+sign$(n_T\cdot\delta)\mu_T$.

The resulting number W(X,C) is called the winding number (some time also called 3D winding number) of the given point a point X in 3-space with respect to C. It does not depend on half-line A and it is constant in any 3D cell, meaning that W(X,C) has the same value for all points X within the same 3D cell. In particular, W(X,C)=0 for all points X within the outer cell.

The invention makes use of the winding number concept. The two-dimensional version of the concept of winding number is well documented in prior art. The three-dimensional winding number is also documented in prior art as an application of the mathematical "topological degree", see for example chapters 4 and 5 of John Willard Milnor's book "Topology from the differentiable point of view", Princeton University Press; Revised edition (Nov. 24, 1997), ISBN-13: 978-0691048338. In the rest of the description, the terms winding number and three-dimensional winding number will be indifferently used.

FIG. 10 illustrates the winding number computation with a planar contour which self-intersects two times. Line segments orientations define normal vectors. The planar contour is oriented from right to left. Given a point X on half-line Δ, the computation of its winding number W is to initialize W:=0 and to move from X toward infinity (toward the right side of the figure) along half-line Δ. During this motion, increment W:=W+1 or decrement W:=W−1 (as illustrated in the figure) when crossing the contour.

As a result of the winding number computation, a simplicial 2-cycle C defines a solid in the following manner: the solid is the closure of the set of points with positive winding number, as illustrated on FIG. 11. The set of such simplicial 2-cycles includes the set of oriented boundary of usual polyhedrons whose vertices have floating point coordinates. However, unlike classical polyhedron boundaries, simplicial 2-cycles are allowed to self intersect in general.

Before moving further, some definitions are necessary to generalize the familiar concepts of "inside", "outside" and Boolean operations.

Figure 28:
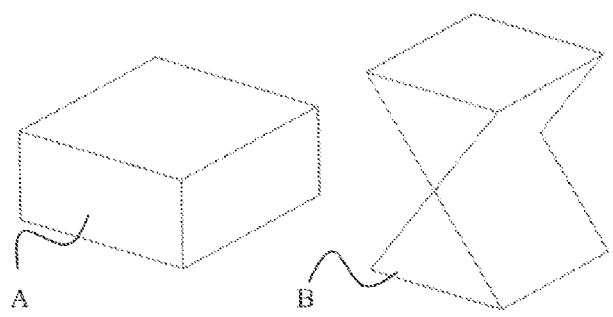
FIGS. 28 to 30 illustrate three-dimensional representations of the objects shown in FIGS. 12 to 15 and FIGS. 19 to 22.
Figure 29:
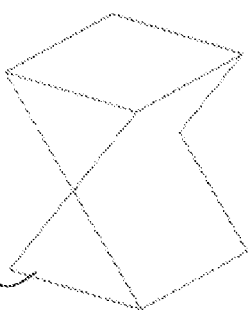
Figure 30:
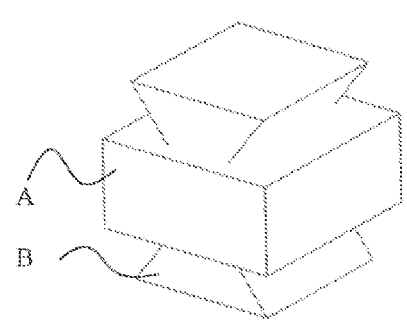

A simplicial 2-cycle A is represented on FIG. 12, and a two simplicial 2-cycle B on FIG. 13. Three-dimensional objects are discussed in FIGS. 12-17 and 19-23, but, for simplicity, only two dimensional objects are illustrated. Incidentally, FIG. 28-30 respectively show three-dimensional representations of the objects represented on FIG. 12, FIG. 13, and FIGS. 14 and 19. A is a rectangle and B is a double triangle. A and B are represented independently together with their respective orientation and winding numbers. A is regular and represent the boundary of a regular solid. B has a self intersection and is therefore regular according to prior art validity criterion of solids, as discussed previously.

One notes $w_A: R^3-|A| \to Z$ and $w_B: R^3-|B| \to Z$ their respective winding number functions. Let $\phi: Z \times Z \to Z$ be a function that computes an integer number given two integer numbers. Let us define the function $\psi: D \to Z$ by composing function $\phi$ and winding numbers, $\psi(x)=\phi(w_A(x),w_B(x))$, where $D=R^3-(|A|\cup|B|)$ is the 3D domain where both $w_A$ and $w_B$ are well defined. Clearly, function $\psi$ is constant over each connected component of $D=R^3-(|A|\cup|B|)$. Function $\psi$ is said to be locally constant in the neighbourhood of point $x \in |A|\cup|B|$ if there exist a real number $\epsilon_0>0$ such that for all $0<\epsilon \le \epsilon_0$, the restriction of $\psi$ to the $\epsilon$-radius open ball centered at x, noted $O(x,\epsilon)$, is a single valued function. In other words, function $\psi$ has the same constant value on "each side" of $x \in |A|\cup|B|$.

Then, by definition, the boundary $\delta\psi$ of function $\psi$ is the set of points $x \in |A|\cup|B|$ where $\psi$ is not locally single valued. This defines a geometrical locus of the resulting simplicial 2-cycle. Let $x \in \delta\psi$ be a point where $\psi$ is locally two valued. Let $\psi^+$ and $\psi^-$ be these two values where $\psi^+$ (respectively $\psi^-$) is the value on the positive side of $\delta\psi$ (respectively the opposite side of $\delta\psi$) according to the orientation resulting from initial operands. Then, the difference $\psi^- - \psi^+$ defines a signed multiplicity at point x. Consequently, a multiplicity for all triangles of $\delta\psi$ is set.

Consequently, defining a generalized Boolean operation between two simplicial 2-cycles A and B is to define the function $\phi$. The resulting simplicial 2-cycle is then $\delta\psi$, associated with triangles multiplicities.

Figure 14:
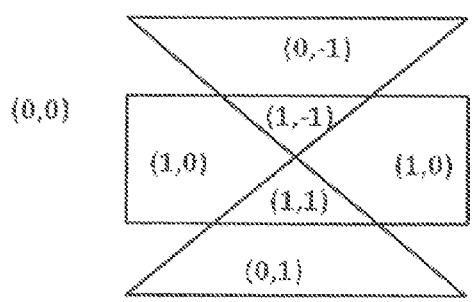
Figure 15:
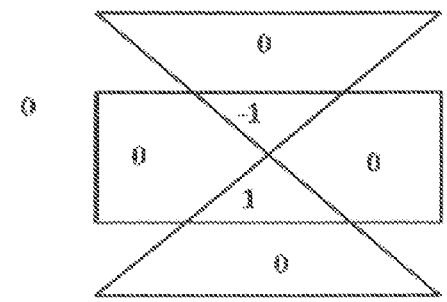

Referring now to FIG. 14, the two simplicial 2-cycles A and B are represented in position for an operation, e.g. computing the union of A and B, together with a couples of values ($w_A$, $w_B$) over each connected components of $D=R^3-(|A|\cup|B|)$. The first number of the couple of value is computed from the simplicial 2-cycle A and the second winding number of each couple of winding numbers is computed from the simplicial 2-cycle B. On FIG. 15, the couples of values ($w_A$, $w_B$) are replaced by the results through a function $\phi$, which is, in the example, defined as the product $\phi(w_A, w_B)=w_A w_B$.

Figure 16:
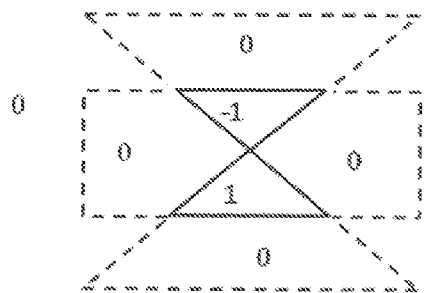

On FIG. 16, the dotted lines represent the portions of $|A|\cup|B|$ where function $\psi(x)=w_A(x)w_B(x)$ is locally single valued, meaning that $|A|\cup|B|$ locally separates two regions where $\psi$ has the same value.

Figure 17:
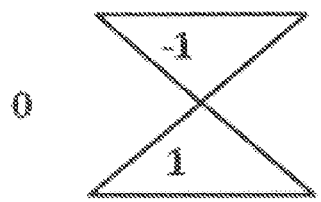

On FIG. 17, the drawing represents the result of the operation performed on the two simplicial 2-cycles A and B: a new cycle is obtained by retaining the portions of $|A|\cup|B|$ where function $\psi$ is not locally single valued. According to the initial orientations and to the values of function $\psi$, the multiplicity of the upper triangle edges is 0−(−1)=1 for edges inherited from operand B and −1−0=−1 for edges inherited from operand A. Multiplicity of the lower triangle edges is 1−0=1.

Therefore, given two simplicial 2-cycles A and B and given a function $\phi$, the process according to the invention computes the resulting simplicial 2-cycle defined by $\delta\psi$. One understands that the following functions $\phi$ redefine usual Boolean operations on regular solids: the union of two solids is defined by the function $\phi(p,q)=\min(1, p+q)$, the intersection by the function $\phi(p,q)=pq$, and the subtraction by the function $\phi(p,q)=\max(0, p-q)$.

Moreover, a boolean operator may simplify the result obtained by applying an edge collapse procedure driven by some chordal error criterion. For example, edges whose length is of the same order of magnitude than the perturbation induced by the rounding of the coordinates may be collapsed without significant loss of geometric information. Advantageously, even if the operation on the two simplicial 2-cycles A and B is likely to induce self-intersections of the boundary, the result is not invalidated as the simplicial 2-cycle resulting from the process of the invention is a closed triangulated polyhedral surface that may feature self intersections.

Figure 18:
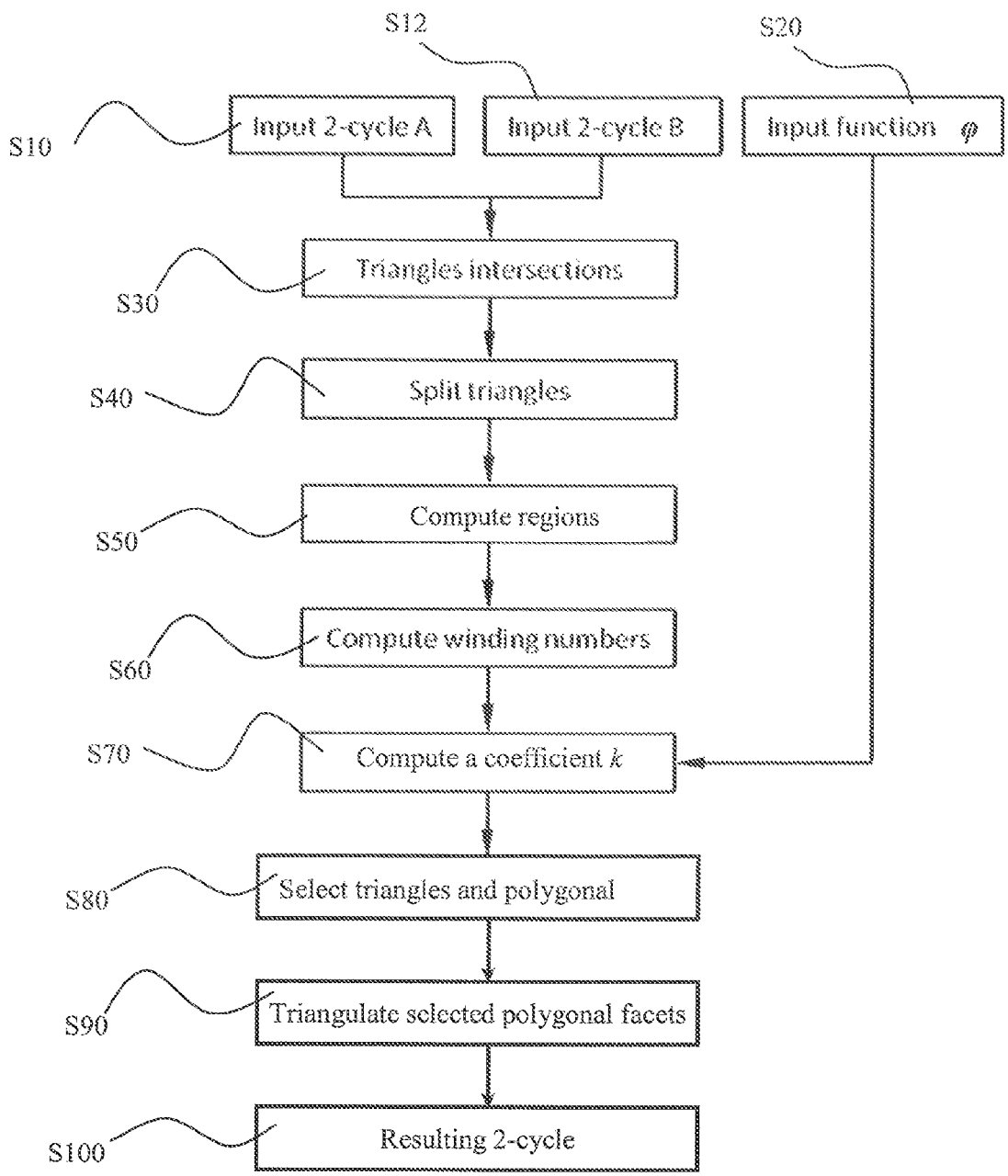
FIG. 18 is a flowchart of a process for computing a resulting closed triangulated polyhedral surface carrying out the invention.

Referring now to FIG. 18, an embodiment of the process according to the invention is described.

At steps S10 and S12, a first modeled object being modeled by a first closed triangulated polyhedral surface and a second modeled object being modeled by a second closed triangulated polyhedral surface are input. Typically, the first and the second modeled objects are simplicial 2-cycles. If required, signed integers can be associated to triangles of the first and second closed triangulated polyhedral surfaces in order to capture orientation inversion and/or multiplicity.

At steps S20, a function $\phi: Z \times Z \to Z$ is selected. The selection of a function $\phi$ allows selecting an operation to perform between the first and second modeled objects. In general, the function $\phi$ redefines usual Boolean operations such as the union, the intersection, and the subtraction of two solids. Any function $\phi$ can be defined, depending on the purpose of the application using the invention. For example, when dealing with self-intersected objects (resulting from a spatial sweeping), a definition of function $\phi$ can decide that the spatial region of interest is where the winding number is positive, while another definition of function $\phi$ may decide that the spatial region of interest is where the winding number is non-zero. Beyond redefining usual Boolean operations, unrestricted definition of the function $\phi$ is a design flexibility provided by the invention.

In practice, the function $\phi$ is selected by the user during a design session. A function $\phi$ may also be selected by default by the CAGD system.

Then, at step S30, intersections between triangles of the first modeled object and triangles of the second modeled object are computed. An intersection is a point, an edge or a polygon where two triangles meet. Thus the step S30 consists in finding all the intersections of triangles which does not consist in a common edge or vertex of triangles of the first or second modeled object.

Several methods may be used for computing the intersections: for example, using standard floating point arithmetic together with epsilon-programming. In practice, the computing of the intersections is performed by using exact arithmetic. Exact arithmetic does not make use of rounding and truncating when performing numerical computations. The exact arithmetic approach is used for making numerically robust geometric algorithms. Advantageously, exact arithmetic enables to obtain correct topological structures of objects which are therefore free from inconsistency.

Moreover, as seen previously, a simplicial 2-cycle is a closed triangulated polyhedral surface that may feature self intersections. In practice, the first and/or the second modeled objects may comprise a self intersection, and therefore, the computing of the intersections between triangles further comprises computing intersections between triangles of the first modeled object and/or between triangles of second modeled objects.

Referring to now FIG. 19, two simplicial 2-cycle A and B have been input. The first object A is the rectangle depicted in FIG. 12, and the second object B is the double triangle comprising a self-intersection depicted in FIG. 13. One reminds that the objects A and B are three-dimensional objects, as illustrated on FIGS. 28-30; but for simplicity, two dimensional objects are used in drawings 19-23. In practice, the user inputs the two objects as known in the art. Moreover, the objects A and B have been positioned each other so that the object B is over the object A. Typically, this is also performed by the user.

On FIG. 20, intersections points 200, 202, 204, and 206 between objects A and B are represented. Moreover, the self-intersection point 208 of the object B is also represented. One reminds that, for the sake of simplicity, the representations of the objects A and B are 2D representations in FIGS. 19-23 and that the intersections which are computed between triangles of the 3D objects A and B are edges or vertices. The computing of the intersections is performed as known in the art, e.g. by using exact arithmetic.

Referring back to FIG. 18, at step S40, the triangles of the first and second modeled objects are split into polygonal facets adjacent to said computed intersections. This amounts to say that the first and second modeled objects A and B are subdivided according to the intersections computed at the step S30.

For instance, on FIG. 21, the computed intersections points between the objects A and B subdivide the objects A into four adjacent portions (2, 10, 4, 5) and the object B is divided into six adjacent portions (1, 7, 9, 3, 8, 6).

Next, at step S50, at least one region is computed. A region comprises a set of triangles and/or polygonal facets which are adjacent to each other and which are delimited by one of the computed intersections. In other terms, a region is a part of the boundary of the first and second modeled objects A and B along the computed intersections. This amounts to say that a set of triangles and/or polygonal facets adjacent to vertices or edges on which the first and second modeled objects A and B meet or self-intersect, form a region.

In practice, an overlay of an arrangement of the computed intersections that splits each triangle into polygonal facets is built. Building the overlay amounts to combining the computed intersections, as known in the art. At this stage, each triangle of the initial objects A and B is subdivided into polygonal facets such that a new representation defining mathematically the same polyhedral cycles of objects A and B is obtained. Advantageously, the supporting complex of the polyhedral cycle is embedded in the ambient three-dimensional space. In other words, any intersecting pair of polygonal facet or edges of the new cycles intersects along a common edge or vertex. This construction is done "exactly", which advantageously implies that vertices resulting from the intersection of an edge and a triangle or of three triangles have rational coordinates. The construction of the new representation is managed symbolically, which implies that in most cases, these rational coordinates are not computed explicitly. Advantageously, resources of the CAGD system are preserved (e.g. CPU, memory, . . . ) as these rational coordinates do not need to be computed.

Non generic situations may occur and they are solved as known in the art. For instance, triangles may overlap, several edges intersecting a triangle at the same point or more than three triangles meeting in a single point may happen. Among these non-generic situations, there is the particular situation in which an overlapping triangle produces new polygonal facet. In such a case, the new computed coefficient k (discussed at step S70) is the sum of the respective coefficients k of the two overlapping triangles.

Next, at step S60, two couples of winding numbers (that is, 3D winding number) p and q are computed for each triangle and each polygonal facet. A winding number (or 3D winding number) of a three-dimensional object provides a generalization of the concept of inner and outer space of a polygonal-cycle. For each couple of winding numbers, the first winding number is computed from the first closed triangulated polyhedral surface and the second winding number is computed from the second closed triangulated polyhedral surface. At least one ray-tracing is performed on a triangle at this step. Advantageously, for a complete robustness, this step requires both exact arithmetic and "simulation of simplicity". The "simulation of simplicity" is a technique to cope with degenerate cases in geometric algorithms, as taught for instance in the document "simulation of simplicity", H. Edelsbrunner, E P. Mücke—ACM Transactions on Graphics (TOG), Volume 9, Issue 1, January 1990, pages: 66-104, ISSN:0730-0301.

In practice, the first and the second couple of winding numbers are respectively computed for each side of a triangle and a polygonal facet. The first side of a polygonal facet (the same applies for a triangle) is called below, and the second side is called above. The notion of below and above of a polygonal facet relies on an arbitrary convention based on a normal vector of each polygonal facet. Indeed, one recalls that each triangle of a polyhedral cycle (e.g. a simplicial 2-cycle) is oriented by the ordering of its three vertices, the ordering of the three vertice being an arbitrary choice. And this ordering defines a normal vector.

Figure 26:
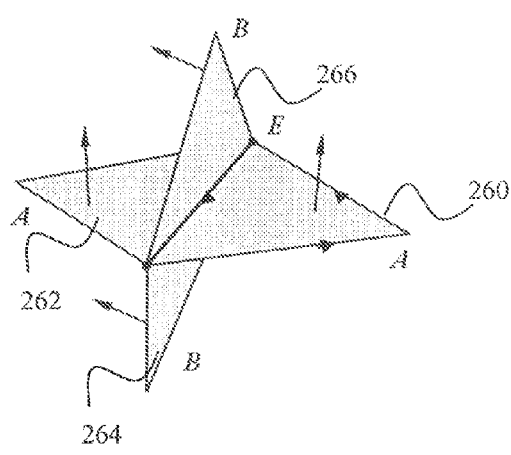
FIGS. 26 and 27 are examples of a winding numbers propagation algorithm.

For instance on FIG. 26, a set of triangle having a common edge E is displayed. Each triangle has its own normal vector, as depicted. The triangle 260 is oriented, and based on this orientation, a normal vector is defined and indicates the "above" of the triangle.

Hence, the first couple of winding numbers, noted $C_{below}$, is below said triangle and polygonal facet according to a normal vector of said triangle and polygonal facet. Inversely, the second couple of winding numbers, noted $C_{above}$, is above said triangle and polygonal facet according to the normal vector of said triangle and polygonal facet.

Referring to FIG. 22, couples of values ($w_A$, $w_B$) of winding numbers of the first and second modeled objects A and B are depicted. The portion 1 of the object B has two couples of winding numbers. The first couple of the portion 1 is noted $C_{below}=(0,0)$ and the second one is noted $C_{above}=(0,-1)$. In this example, the normal vector of the portion 1 (represented on FIG. 21) involves that the couple (0,−1) is arbitrary considered as being above the portion 1. Other portions of objects A and B are discussed in the table below.

In practice, one associates to each region computed at the step (S50) two couples of (3D) winding numbers. The first couple of winding numbers is $C_{below}=(w_A, w_B)$ immediately below (the normal vector of) the computed region and the second couple of winding numbers is $C_{above}=(w_A, w_B)$ immediately above (the normal vector of) region. The two couples $C_{below}=(w_A, w_B)$ and $C_{above}=(w_A, w_B)$ associated to each computed region are the two couples of winding numbers computed for a polygonal facet (or a triangle) which belongs to the region. Then, the couples of (3D) winding numbers $C_{below}$ and $C_{above}$ are propagated to adjacent regions and triangles. The term propagation means that a first couple $C_{below}$ and a second couple $C_{above}$ spread into new computed polygonal facets and or triangles. In other terms, a dedicated algorithm is used for computing the couples of (3D) winding numbers of the other polygonal facets of the region. This algorithm thus relies on the computed regions in order to perform the computing of the couples of winding numbers of the polygonal facets that belong to the region. This algorithm is detailed now.

The algorithm starts with the computation of $C_{below}$ and $C_{above}$ of a polygonal facet (or triangle) which belongs to a first computed region. The choice of a polygonal facet is arbitrary and does not influence the output of this algorithm. Then the values of these two couples of winding numbers $C_{below}$ and $C_{above}$ are computed (one could also say that they are propagated) to adjacent polygons facet. At this stage, adjacent polygons facet may be another computed region or a triangle. One recalls that by definition, two polygons are adjacent if they share at least one edge. In addition, and still by definition, an edge shared by exactly two polygons is a manifold edge, as represented on FIG. 24. Also by definition, an edge shared by three polygons or more is a non-manifold edge. On FIG. 25, a non-manifold edge is drawn with four incident polygons.

Now, and in reference to FIGS. 26 and 27, the computing (or propagation) of the couples of winding numbers $C_{below}$ and $C_{above}$ of adjacent facets is detailed.

In FIG. 26, let E be a non-manifold edge, shared by four polygons. This edge is a computed intersection between the first and second modeled objects A and B: the two horizontal polygons 260 and 262 belong to the first modeled object A, and the two perpendicular polygons 264 and 266 belong to the second modeled object B. Incidentally, on can notice that each polygon is equipped with a normal vector according to its geometry and orientation, as discussed previously.

In reference now to FIG. 27: let suppose that two couples of winding numbers $C_{below}$ and $C_{above}$ are known for one adjacent polygon, e.g. couples of winding numbers $C_{below}=(w_A, w_B)$ and $C_{above}=(w_A, w_B)$ of the polygon 260. The polygons are sorted in a radial order around the edge E. The radial order may be chosen according to a rotation around the edge E. For instance, starting from the polygon 260 and a counter-clockwise rotation 268, the radial order of the polygons adjacent to the edge E is 260, 266, 262, and 264.

Then, starting from a given triangle or a given polygonal facet, a rotation is performed according to the radial order around the computed intersection. This amounts to say that, starting from the polygon 260, the polygons 266, 262, and 264 are successively crossed.

Next, the crossings of the other triangles and/or polygonal facets adjacent to the computed intersection are detected. After each crossing detecting, the two couples of winding numbers are updated. The update is performed according to the orientation of the normal vector of the crossed triangle and/or polygonal facet.

The update may be carried out based on the three following rules:
  Crossing a polygon of the first modeled objects A changes the winding number $w_A$ into $w_A+1$ (respectively $w_A-1$) if the normal vector of the polygon is oriented in the radial order (respectively in the opposite radial order);
  (ii) Crossing a polygon of the second modeled object B changes the winding number $w_B$ into $w_B+1$ (respectively $w_B-1$) if the normal vector of the polygon is oriented in the radial order (respectively in the opposite radial order)
  (iii) Crossing a polygon from the first modeled objects A (respectively B) does not change winding number $w_B$ (respectively $w_A$).

Figure 27:
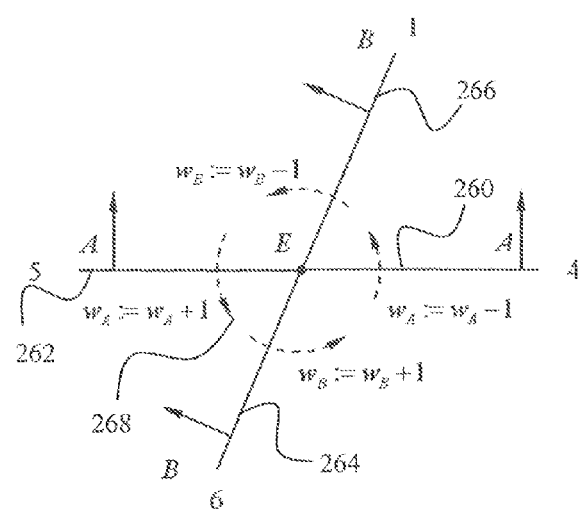

FIG. 27 illustrates the application of the above-mentioned rules. For the sake of simplicity, one limits the example to the computing (or propagation) of the couple of winding number $C_{above}=(w_A, w_B)$. Starting from the polygon 260 having the couple of winding number $C_{above}=(w_A, w_B)$, the first crossed polygon is the polygon 266. Once the crossing of the polygon 266 has been detected, the couple of winding number is updated so that the updating changes the winding number $w_B$ into $w_B-1$. The computed couple of winding number of the polygon 266 is therefore $C_{above}=(w_A, w_B-1)$. Similarly, the polygon 262 is crossed, and the computed couple of winding number of the polygon 262 is therefore $C_{above}=(w_A+1, w_B-1)$. Next, after crossing the polygon 264, the computed couple of winding number of the polygon 264 is $C_{above}=(w_A+1, w_B)$.

Consequently, since the winding numbers variations are known, it is easy to update the couples of winding number $C_{below}$ and $C_{above}$ of all computed regions adjacent to a manifold or a non-manifold computed intersection. One understands that an advantage of this algorithm is that the number of computing of winding number is decreased. This is particularly advantageous as resources of the system are preserved, and the computation time is highly reduced.

The computation of the couples of winding numbers may also be performed on extended regions. An extended region does not comprise the sets of triangles and/or polygonal facets adjacent of a region. An extended region is comprised of the set of adjacent triangles of a first modeled object which are neither in contact with polygons of a second modeled object nor in contact with self-intersections. Thus, one understands that initial values of $C_{below}$ and $C_{above}$ of a triangle in an extended region is the same for all triangles in the same extended region. This amounts to say that an extended region comprises the maximum number of connected triangles of a modeled object having the same $C_{below}$ and $C_{above}$. Thus, within an extended region, initial computed couples of winding number $C_{below}$ and $C_{above}$ can be easily computed (one could also say propagated) to the whole connected triangles of the modeled object. Consequently, the computing procedure within an extended region is repeated for each connected triangle of the modeled object. Again, one understands that it advantageously allows increasing the performances of the process according to the invention as well as preserving the resources of the CAGD system.

Then, at step S70 of FIG. 18, a coefficient k is computed for each triangle and each polygonal facet of the first and second modeled object. Let remind that, by definition, the boundary δψ of function ψ is the set of points x∈|A|∪|B| where ψ is not locally single valued, thus defining a geometrical locus of the resulting simplicial 2-cycle δψ, and that ψ⁺ and ψ⁻ are two values where ψ⁺ (respectively ψ⁻) is the value on the positive side of δψ (respectively the opposite side of δψ) according to the orientation resulting from initial operands. Then, the difference ψ⁻−ψ⁺ defines a signed multiplicity at point x, and consequently, a multiplicity for all triangles of δψ is set. The resulting simplicial 2-cycle is then δψ, associated with triangles multiplicities. One understands that the multiplicity advantageously allows to obtain a simplicial 2-cycle in the case of a function ψ having integer values; otherwise, the function ψ would have only 0 or 1 as values.

The coefficient k is computed with a function φ having as inputs the two couples of winding numbers p and q computed for each triangle and each polygonal facet of the first and second modeled objects. In practice, the coefficient k is computed as follow: $k=\phi(C_{below})-\phi(C_{above})$, which amounts to computing a signed multiplicity for each triangle and each polygonal facet of the first and second modeled objects.

Next, at step S80, triangles and polygonal facets of the first and second modeled objects are selected according to the computed coefficients. Selection here means that the selected triangles and polygonal facets are kept for obtaining the resulting simplicial 2-cycle. In practice, the triangles and polygonal facets are selected when the computed coefficient k is different from zero.

Next, at step S90, the polygonal facets, which are not triangles, are triangulated. The triangulation is performed as known in the art.

Then, at step S100, the resulting closed triangulated polyhedral surface is obtained with the selected triangles and the triangulated selected polygonal facets.

The steps S60 to S100 are illustrated by FIGS. 20-23.

At FIG. 20, the intersections points 200, 202, 204, 206, and 210 between objects A and B and the self-intersection point 208 of object B are represented and the first and second modeled objects A and B are subdivided according to the intersections computed.

Then, at FIG. 21, the extended regions are shown. The extended regions are identified on the figure with numerical values 1 to 10. In this example, the four adjacent portions (2, 10, 4, 5) of object A and the six adjacent portions (1, 7, 9, 3, 8, 6) of portion B are extended regions. It is now possible to associate to each extended region all the coefficients used to select the resulting simplicial 2-cycle: $C_{below}$, $C_{above}$ and $k=\phi(C_{below})-\phi(C_{above})$, as gathered in next table. In the example in next table, one takes $\phi(w_A, w_B)=w_A w_B$. Extended regions belonging to the resulting simplicial 2-cycle are visible in the rightmost column.

| Operand | Extended region | $C_{below}$ | $C_{above}$ | $\phi(C_{below}) - \phi(C_{above})$ | Belongs to the resulting 2-cycle? |
|---|---|---|---|---|---|
| B | 1 | (0, 0) | (0, −1) | 0 − 0 = 0 | No |
| A | 2 | (1, 0) | (0, 0) | 0 − 0 = 0 | No |
| B | 3 | (0, 1) | (0, 0) | 0 − 0 = 0 | No |
| A | 4 | (1, 0) | (0, 0) | 0 − 0 = 0 | No |
| A | 5 | (1, −1) | (0, −1) | −1 − 0 = −1 | Yes, opposite orientation |
| B | 6 | (1, 0) | (1, −1) | 0 − (−1) = −1 | Yes, initial orientation |
| B | 7 | (1, 0) | (1, −1) | 0 − (−1) = 1 | Yes, initial orientation |
| B | 8 | (1, 1) | (1, 0) | 1 − 0 = 1 | Yes, initial orientation |
| B | 9 | (1, 1) | (1, 0) | 1 − 0 = 1 | Yes, initial orientation |

-continued

| Operand | Extended region | $C_{below}$ | $C_{above}$ | $\phi(C_{below}) - \phi(C_{above})$ | Belongs to the resulting 2-cycle? |
|---|---|---|---|---|---|
| A | 10 | (1, 1) | (0, 1) | 1 − 0 = 1 | Yes, initial orientation |

On FIG. 23 is illustrated the resulting simplicial 2-cycle defined by extended regions 5, 6, 7, 8, 9 and 10. One can notice that the extended region 5 must be involved according to the opposite orientation (new orientation is illustrated), which is captured by the sign of $\phi(C_{below})-\phi(C_{above})$ in the previous table. This allows to insure that the orientation of the surface of the resulting simplicial 2-cycle is globally consistent.

Figure 31A:
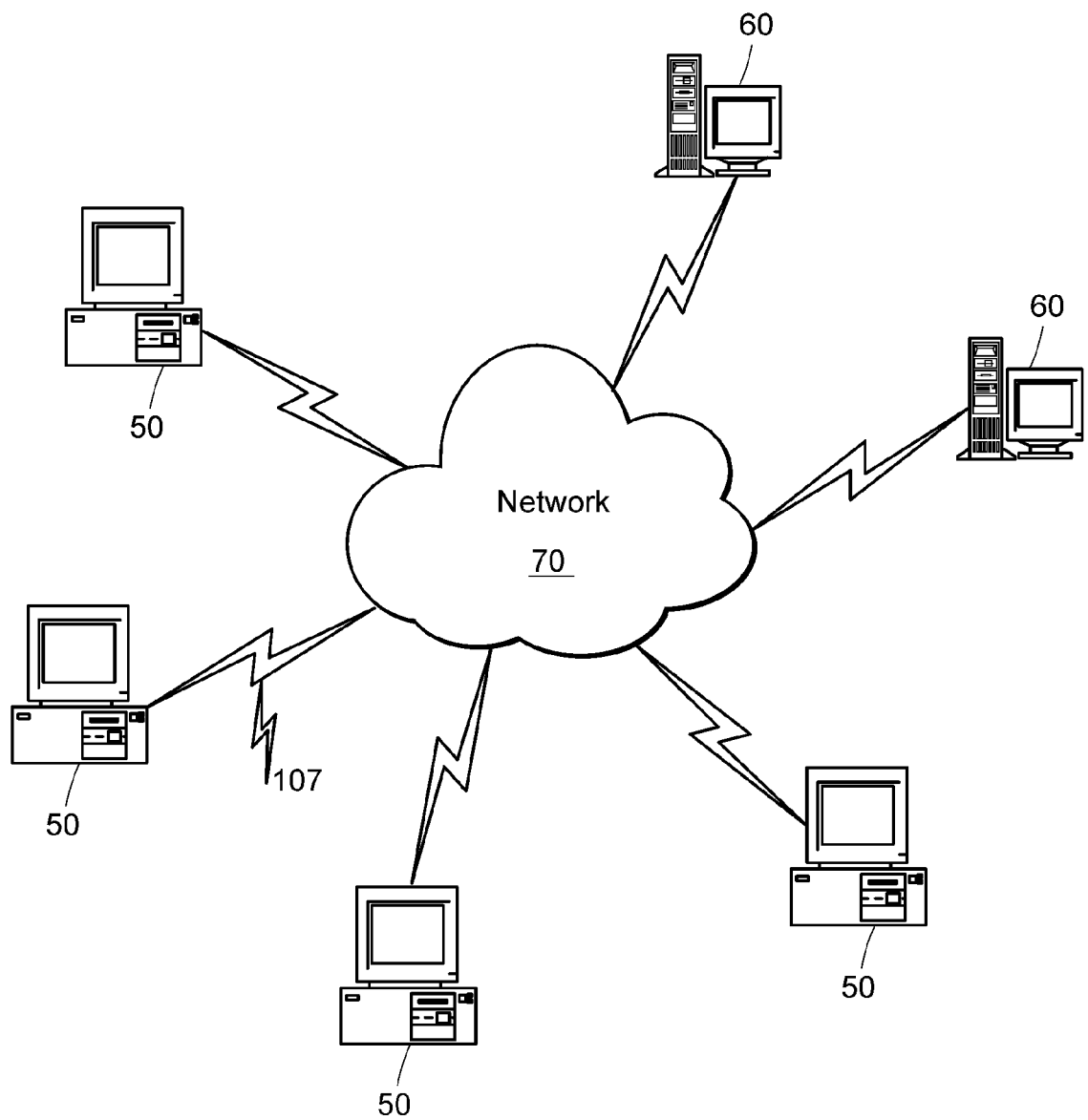
FIGS. 31a-31b are schematic and block diagrams of a computer system implementing embodiments of the present inventor.
Figure 31B:
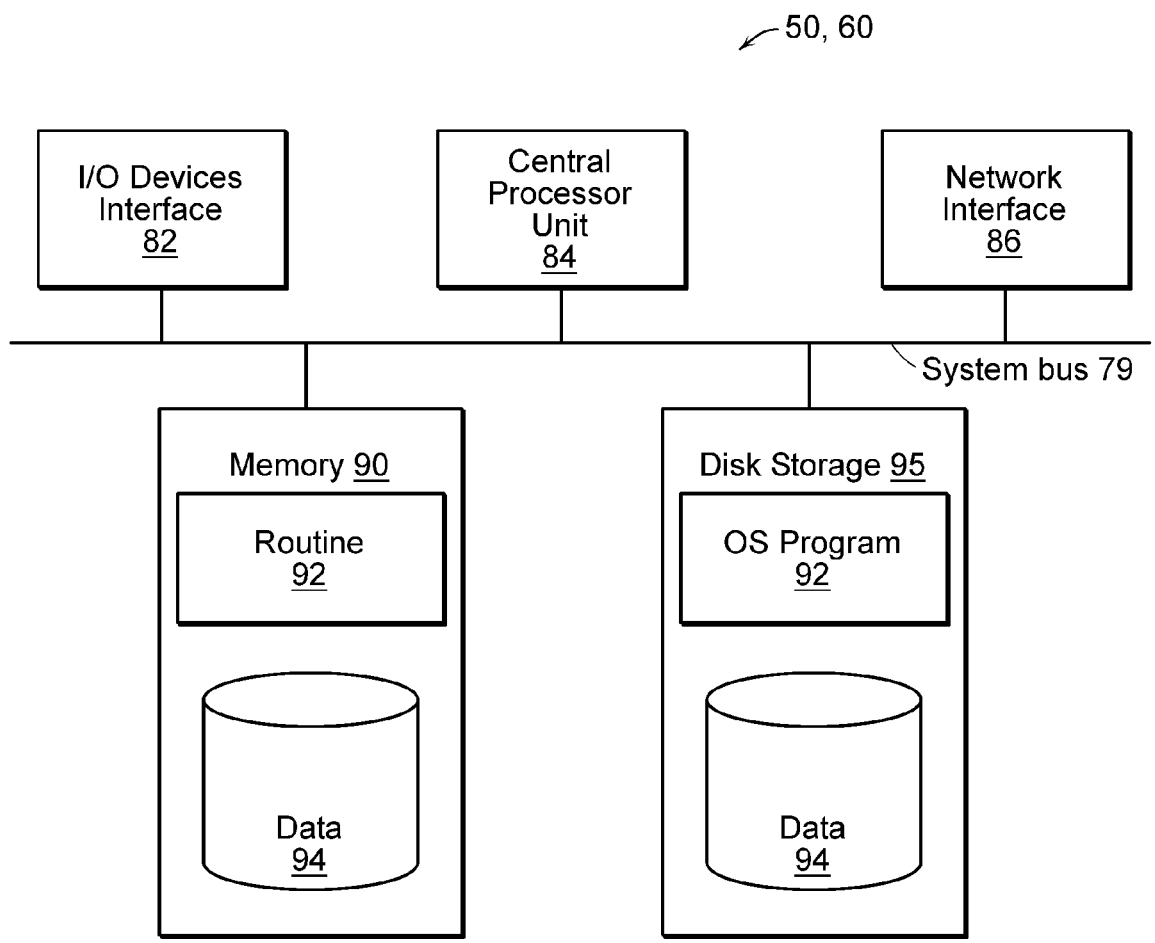

It is to be understood that the foregoing method can be applied to any CAGD system. The invention may be embodied as a system, method, or computer program such as in client/server computers 50, 60 illustrated in FIGS. 31a-b. The invention may be implemented as a in digital electronic circuitry, or in computer hardware, firmware, resident software, micro-code, software, or in combinations of them at 50, 60, 70. Apparatus of the invention may be implemented in a computer program product tangibly embodied in a machine-readable storage device 90, 95 for execution by a programmable processor 84; and method steps of the invention may be performed by a programmable processor 50, 60, 84 executing a program of instructions 92 to perform functions of the invention by operating on input data 94 and generating output 82.

The invention may advantageously be implemented in one or more computer programs that are executable on a programmable system 50, 60 including at least one programmable processor 84 coupled to receive data and instructions from, and to transmit 70, 79, 86 data and instructions to, a data storage system 95, at least one input device 82, and at least one output device 82. The application program 92 may be implemented in a high-level procedural or object-oriented programming language or in assembly or machine language if desired; and in any case, the language may be a compiled or interpreted language.

Generally, a processor 84 (50, 60) will receive instructions 92 and data 94 from a read-only memory 95 and/or a random access memory 90. Any combination of one or more computer readable medium(s) 90, 95 may be utilized to store instructions 92. The computer readable medium may be a computer readable storage medium 95. A computer readable storage medium may be, for example, but not limited to, an electronic, magnetic, optical, electromagnetic, infrared, or semiconductor system, apparatus, or device, or any suitable combination of the foregoing. Storage devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks. Any of the foregoing may be supplemented by, or incorporated in, specially designed ASICs (application-specific integrated circuits).

The computer readable medium may be a computer readable signal medium 107. A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

The preferred embodiment of the present invention has been described. It will be understood that various modifications may be made without departing from the spirit and scope of the invention. Therefore, other implementations are within the scope of the following claims.

For instance, it is possible to increase the performances of the whole process according to the invention with optimizations. A first optimization may consist in using the notion of filtered predicate, described for instance in the documents "Polyhedral modelling with multiprecision integer arithmetic", S. Fortune, Computer Aided Design, 29 (2), pages 123-133, 1997, "Efficient exact arithmetic for computational geometry", S. Fortune and C. J. Van Wyk, Proceedings of the ninth annual symposium on Computational geometry, pages 163-172, ACM New York, N.Y., USA, 1993, and "A lazy exact arithmetic", Mohand Ourabah Benouamer, P. Jaillon, Dominique Michelucci, and Jean-Michel Moreau, IEEE Symposium on Computer Arithmetic, pages 242-249, 1993.

Moreover, the barycentric coordinates of the constructed vertices are computed in interval arithmetic. Each time a predicate is called, typically returning the sign of a determinant, it tries to determine the sign using these interval coordinates and if this is not possible, it calls the rational arithmetic version of the predicate, which, if this has not been done previously, computes first the required barycenric coordinates of the impacted constructed vertices.

In the step S30 of the process as depicted in FIG. 18, the computing of intersections between triangles of the first modeled object and triangles of the second modeled object can be accelerated using a partition of the operands in set of triangles, called patches, defined as follows:
 (i) There exists a vector d featuring a positive dot product with all the normal vectors of the oriented triangles of the patch;
 (ii) The projection along the direction d on a plane orthogonal to d of the boundary of the patch has no self-intersection.

Indeed, it can be shown that in this case, the patch has no self-intersection and it is sufficient to test the possible intersections between triangles of distinct patches. If these patches are localized in a spatial partition structure such as voxels or octrees, it can significantly speed up the step S30, as described in the documents "Solid Representation and Operation Using-Extended Octrees", P. Brunet and I. Navazo, ACM Transactions on Graphics, 9(2) pages 170-197, 1990, "Fundamental techniques for geometric and solid modeling", and C. M. Hoffmann and G. Vanecek, Manufacturing and Automation Systems: Techniques and Technologies, 48 pages 347-356, 1990. Paragraph II.B.

For example, if a voxel contains only one patch, there can be no intersection.

Furthermore, another optimization may consist in simplifying the resulting closed triangulated polyhedral surface (S100) by a sequence of edge collapses driven by a chordal error. Indeed, since the operations performed in former steps S30-S90 are exact, extremely small triangles may occur, possibly much smaller than the weight of the last digit of the floating point numbers defining the coordinates of the vertices of the input operands. In process of the present invention, this simplification procedure is the combinatorial counterpart of the rounding of number in floating points.

The invention claimed is:

1. A computer-implemented process, in a computer-aided geometric design system, for computing a resulting closed triangulated polyhedral surface from a first and a second modeled objects, the first modeled object being modeled by a first closed triangulated polyhedral surface and the second modeled object being modeled by a second closed triangulated polyhedral surface, the process comprising:
 in a digital processor:
  computing intersections between triangles of the first modeled object and triangles of the second modeled object;
  splitting triangles of the first and second modeled objects into polygonal facets, the polygonal facets being adjacent to said intersections;
  computing at least one region, wherein a region comprises at least one of a set of triangles or a set of polygonal facets that are adjacent to each other and that are delimited by one of the computed intersections;
  determining at least one of all triangles or all polygonal facets of said region, the triangles or polygonal facets being adjacent to a common computed intersection, wherein each triangle or polygonal facet comprises a normal vector defined according to the geometry and the orientation of each triangle or polygonal facet;
  computing two couples of winding numbers p and q for a given triangle or a given polygonal facet of a region, wherein the first winding number of each couple of winding numbers is computed from the first closed triangulated polyhedral surface and the second winding number of each couple of winding numbers is computed from the second closed triangulated polyhedral surface;
  computing a coefficient k for each triangle and each polygonal facet, the coefficient being computed with a function $\phi$ having as inputs the two couples of winding numbers p and q of each triangle and each polygonal facet, by:
 (i) starting from the given triangle or the given polygonal facet, performing a rotation according to a radial order around the computed intersection for crossing at least one of the other triangles or the polygonal facets adjacent the computed intersection;
 (ii) detecting the crossing of at least one of the other triangles or polygonal facets adjacent the computed intersection;
 (iii) after each crossing, updating the couples of winding numbers p and q according to the orientation of the normal vector of at least one of the crossed triangle or polygonal facet;
  selecting triangles and polygonal facets according to the computed coefficients;
  triangulating said selected polygonal facets;
  obtaining the resulting closed triangulated polyhedral surface with the selected triangles and the triangulated selected polygonal facets; and
  outputting the resulting closed triangulated polyhedral surface in the computer-aided geometric design system such that the computer-aided geometric design system renders the resulting closed triangulated polyhedral surface in a display of a modeled object.

2. The computer-implemented process of claim 1, wherein:
 at least one of the first or second modeled objects modeled by a closed triangulated polyhedral surface comprises a self intersection; and
 the step of computing intersections between triangles further comprises computing intersections between triangles of said at least one of the first or second modeled objects modeled by a closed triangulated polyhedral surface.

3. The computer-implemented process of claim 1, wherein at the step of computing two couples of winding numbers:
the first couple of winding numbers $C_{below}$ is below said triangle and polygonal facet according to a normal vector of said triangle and polygonal facet; and
the second couple of winding numbers $C_{above}$ is above said triangle and polygonal facet according to the normal vector of said triangle and polygonal facet.

4. The computer-implemented process of claim 1, wherein the function φ having as inputs the two couples of winding numbers p and q of each triangle and each polygonal facet performs one of the following operations:
φ(p, q)=min(1, p+q)
φ(p, q)=p*q
φ(p, q)=max(0, p−q).

5. The computer-implemented process of claim 1, wherein the triangles and polygonal facets are selected when the computed coefficient k is different from zero.

6. The computer-implemented process of claim 1, wherein at the step of computing intersections, common edges or common vertices between the triangles of the first modeled object and the triangles of the second modeled object of triangles are excluded.

7. The computer-implemented process of claim 6, wherein the step of computing intersections is carried out by using exact arithmetic.

8. The computer-implemented process of claim 1, further comprising after the step of splitting triangles, a step of computing an overlay representing the computed intersections.

9. The computer-implemented process of claim 8, wherein the computed overlay has rational coordinates.

10. A computer program product for computing a resulting closed triangulated polyhedral surface from a first and a second modeled objects, the first modeled object being modeled by a first closed triangulated polyhedral surface and the second modeled object being modeled by a second closed triangulated polyhedral surface, the computer program product comprising:
a non-transitory computer readable medium;
program code stored on the computer readable medium, the program code comprising instructions causing a computer to:
compute intersections between triangles of the first modeled object and triangles of the second modeled object;
split triangles of the first and second modeled objects into polygonal facets, the polygonal facets being adjacent to said intersections;
compute at least one region, wherein a region comprises at least one of a set of triangles or a set of polygonal facets that are adjacent to each other and that are delimited by one of the computed intersections;
determine at least one of all triangles or all polygonal facets of said region, the triangles or polygonal facets being adjacent to a common computed intersection, wherein each triangle or polygonal facet comprises a normal vector defined according to the geometry and the orientation of each triangle or polygonal facet;
compute two couples of winding numbers p and q for a given triangle or a given polygonal facet of a region, wherein the first winding number of each couple of winding numbers is computed from the first closed triangulated polyhedral surface and the second winding number of each couple of winding numbers is computed from the second closed triangulated polyhedral surface;
compute a coefficient k for each triangle and each polygonal facet, the coefficient being computed with a function φ having as inputs the two couples of winding numbers p and q of each triangle and each polygonal facet, by
(i) starting from the given triangle or the given polygonal facet, performing a rotation according to a radial order around the computed intersection for crossing at least one of the other triangles or the polygonal facets adjacent the computed intersection;
(ii) detecting the crossing of at least one of the other triangles or polygonal facets adjacent the computed intersection;
(iii) after each crossing, updating the couples of winding numbers p and q according to the orientation of the normal vector of at least one of the crossed triangle or polygonal facet;
select triangles and polygonal facets according to the computed coefficients;
triangulate said selected polygonal facets; and
obtain the resulting closed triangulated polyhedral surface with the selected triangles and the triangulated selected polygonal facets.

11. An apparatus for computing a resulting closed triangulated polyhedral surface from a first and a second modeled objects, the first modeled object being modeled by a first closed triangulated polyhedral surface and the second modeled object being modeled by a second closed triangulated polyhedral surface, the apparatus comprising:
at least one processing unit operable to:
compute intersections between triangles of the first modeled object and triangles of the second modeled object;
split triangles of the first and second modeled objects into polygonal facets, the polygonal facets being adjacent to said intersections;
compute at least one region, wherein a region comprises at least one of a set of triangles or a set of polygonal facets that are adjacent to each other and that are delimited by one of the computed intersections;
determine at least one of all triangles or all polygonal facets of said region, the triangles or polygonal facets being adjacent to a common computed intersection, wherein each triangle or polygonal facet comprises a normal vector defined according to the geometry and the orientation of each triangle or polygonal facet;
compute two couples of winding numbers p and q for a given triangle or a given polygonal facet of a region, wherein the first winding number of each couple of winding numbers is computed from the first closed triangulated polyhedral surface and the second winding number of each couple of winding numbers is computed from the second closed triangulated polyhedral surface;
compute a coefficient k for each triangle and each polygonal facet, the coefficient being computed with a function φ having as inputs the two couples of winding numbers p and q of each triangle and each polygonal facet, by
(i) starting from the given triangle or the given polygonal facet, performing a rotation according to a radial order around the computed intersection for crossing at least one of the other triangles or the polygonal facets adjacent the computed intersection;

(ii) detecting the crossing of at least one of the other triangles or polygonal facets adjacent the computed intersection;
(iii) after each crossing, updating the couples of winding numbers p and q according to the orientation of the normal vector of at least one of the crossed triangle or polygonal facet;
select triangles and polygonal facets according to the computed coefficients;
triangulate said selected polygonal facets; and
obtain the resulting closed triangulated polyhedral surface with the selected triangles and the triangulated selected polygonal facets.

* * * * *